United States Patent
Saruwatari et al.

(10) Patent No.: US 9,255,951 B2
(45) Date of Patent: Feb. 9, 2016

(54) POTENTIOMETER DEGRADATION EVALUATING METHOD

(71) Applicant: Azbil Corporation, Tokyo (JP)

(72) Inventors: Makoto Saruwatari, Tokyo (JP); Hiroaki Narita, Tokyo (JP); Takuji Abe, Tokyo (JP)

(73) Assignee: AZBIL CORPORATION, Tokyo (JP)

( * ) Notice: Subject to any disclaimer, the term of this patent is extended or adjusted under 35 U.S.C. 154(b) by 0 days.

(21) Appl. No.: 13/785,562

(22) Filed: Mar. 5, 2013

(65) Prior Publication Data

US 2013/0229195 A1   Sep. 5, 2013

(30) Foreign Application Priority Data

Mar. 5, 2012   (JP) .................................. 2012-048483

(51) Int. Cl.
| | |
|---|---|
| *G01R 27/14* | (2006.01) |
| *G01R 35/00* | (2006.01) |
| *G01R 31/28* | (2006.01) |
| *G01R 31/02* | (2006.01) |
| *G01D 5/165* | (2006.01) |

(52) U.S. Cl.
CPC ............ *G01R 27/14* (2013.01); *G01R 31/2829* (2013.01); *G01R 35/00* (2013.01); *G01D 5/165* (2013.01); *G01R 31/02* (2013.01)

(58) Field of Classification Search
CPC ...... G01R 27/14; G01R 27/08; G01R 27/205; G01R 27/02; G01R 31/02; G01R 31/08; G01R 3/2829; G01R 35/00; G01R 31/2829; G01R 1/28; G01R 17/00; G01D 5/165; G01D 3/08; G01L 1/225

USPC ........ 324/73.1, 168, 523, 705–723, 600, 649, 324/691–699; 318/663, 628, 600, 567, 295; 338/89, 160; 330/178; 388/824, 838; 702/107

See application file for complete search history.

(56) References Cited

U.S. PATENT DOCUMENTS

| | | | | |
|---|---|---|---|---|
| 3,852,665 | A | * 12/1974 | Bothner | .................. B07C 5/344 |
| | | | | 324/701 |
| 5,165,272 | A | * 11/1992 | Kleinhans et al. | ......... 73/114.36 |
| 6,181,141 | B1 | * 1/2001 | Juntunen et al. | ............... 324/525 |

(Continued)

FOREIGN PATENT DOCUMENTS

| | | | |
|---|---|---|---|
| DE | EP 2151670 A1 * | 2/2010 | ............... G01D 3/08 |
| JP | 63-148172 A | 6/1988 | |

(Continued)

OTHER PUBLICATIONS

JP H07-95081, Isuzu Motors LTD, Koshizawa Toshibumi, Fault Diagnosing device for potentiometer, Pub Date Oct. 11, 1995, (Machine translation).*

(Continued)

*Primary Examiner* — Melissa Koval
*Assistant Examiner* — Felicia Farrow
(74) *Attorney, Agent, or Firm* — Troutman Sanders LLP

(57) ABSTRACT

In a method for evaluating degradation of a potentiometer, a plurality of evaluation items, from minor to major, are established as evaluation items for degradation in performance prior to failure of a potentiometer. The degradation of the potentiometer in performance of the plurality of evaluation items is evaluated in terms of stages, in a specific sequence.

6 Claims, 10 Drawing Sheets

(56) References Cited

U.S. PATENT DOCUMENTS

| | | | |
|---|---|---|---|
| 6,184,695 B1* | 2/2001 | Glaser et al. | 324/713 |
| 7,925,361 B2* | 4/2011 | Bak | A61B 6/547 |
| | | | 324/549 |
| 2002/0023367 A1* | 2/2002 | Shibuya | 33/733 |
| 2006/0139143 A1* | 6/2006 | Ruettiger | G01R 27/02 |
| | | | 338/160 |
| 2008/0094080 A1* | 4/2008 | Dorwarth et al. | G01D 5/1655 |
| | | | 324/714 |

FOREIGN PATENT DOCUMENTS

| | | |
|---|---|---|
| JP | 7-95081 B2 | 10/1995 |
| JP | 11-133082 A | 5/1999 |

OTHER PUBLICATIONS

Japanese Office Action mailed Aug. 25, 2015, which issued during prosecution of Japanese Application No. 2012-048483.

* cited by examiner

|  | | | | Units |
|---|---|---|---|---|
| Time | t | t + 0.1 | t + 0.2 | (s) |
| Resistance Value | 21 | 22 | 24 | (Ω) |
| Speed | – | 10 | 20 | (Ω/s) |
| Acceleration | – | – | 50 | (Ω/s²) |

US 9,255,951 B2

POTENTIOMETER DEGRADATION EVALUATING METHOD

CROSS REFERENCE TO RELATED APPLICATION

This application claims priority to Japanese Patent Application No. 2012-048483, filed on Mar. 5, 2012, the entire content of which being hereby incorporated herein by reference.

FIELD OF TECHNOLOGY

The present invention relates to a potentiometer degradation evaluating method for performing staged evaluations of degradation of potentiometer performance.

BACKGROUND ART

Conventionally, potentiometers have been used in detecting rotational angles of electric valve actuators, and the like. Given the structure of the potentiometer, there is a tendency for the resistor to become damaged through wear by the slider, producing dust, where this is particularly severe in any sliding range that is used frequently. The result is that the slider becomes slightly dislocated, producing a phenomenon wherein a large change in the resistance value may occur suddenly. As a result, a large change in the potentiometer output signal may also occur suddenly, appearing as a spike signal S such as shown in FIG. 11. Note that in FIG. 11, the horizontal axis is the potentiometer dislocation (the slider dislocation) or angle, and the vertical axis is the magnitude of the output signal of the potentiometer.

When this type of spike signal appears in the output signal of the potentiometer, then there may be a sudden malfunction in the control operation of a control device that is operating based on the provision of this output signal. Given this, for example, in Japanese Examined Patent Application Publication H7-95081, the spike signal that appears in the output signal of the potentiometer is detected, and if the spike signal is greater than a specific upper limit value or less than a lower limit value, or if the rate of change of the spike signal is greater than a specific value, then this is evaluated as a failure. When the potentiometer is diagnosed with a failure, that the control devices, and the like, that operate based on the provision of the output signal thereof switch immediately to perform predetermined signal-failure control.

However, because the spike signals (noise), described above, are produced in an early stage of the changes in the potentiometer over time, the occurrence of this noise is not a problem, and thus there is a problem in that it is evaluated as a failure despite the ability to continue use thereafter. That is, in Japanese Examined Patent Application Publication H7-95081, only the single phenomenon of noise having occurred is captured, and evaluated as a failure in a stage that is too early, and thus there is a problem in that this reduces system uptime and causes expenses in terms of time and cost in replacing components.

The present invention is to solve such a problem, and an aspect of the present invention is to provide a potentiometer degradation evaluating method wherein it is possible to know, in a staged manner, the progress of the degradation in the performance of the potentiometer.

SUMMARY

The present invention, in order to achieve the above-discussed aspect, determines a plurality of evaluation items ranging from minor to major to be used as evaluation items for the degradation of performance prior to arriving at a potentiometer failure, and evaluates in a staged manner, following a specific sequence, the degradation of the performance in this plurality of evaluation items.

For example, in the present invention, a production of noise is evaluated as an evaluation item for the degradation in the performance of the potentiometer, where if that is acceptable, then the loss of linearity between the input and the output (hereinafter termed simply "linearity") is evaluated, and if that is acceptable, then the change in the resistance value is evaluated, where if that is acceptable, then the increase in rotational torque is evaluated.

As a result, it is possible to know, in a staged manner, the state of progress of the degradation of performance of the potentiometer. That is, it is possible to know the current stage of degradation of performance, whether it is the stage wherein noise is produced, the stage wherein there is loss of linearity, the stage wherein the resistance value changes, or the stage wherein the rotational torque increases.

The present invention determines, as evaluation items for the degradation of performance before arriving at a potentiometer failure, a plurality of evaluation items from minor to major, and evaluates, in a staged manner, the degradation of performance of the plurality of evaluation items in a specific sequence, thus making it possible to know, in a staged manner, the state of progress of degradation of the performance of the potentiometer, thus making it possible to avoid a diagnosis of a failure into early a stage, thereby improving the system uptime, and enabling parts to be replaced with the appropriate timing depending on the state of use.

DETAILED DESCRIPTION

A form of example according to the present invention will be explained below in detail, based on the drawings.

Figure 1:
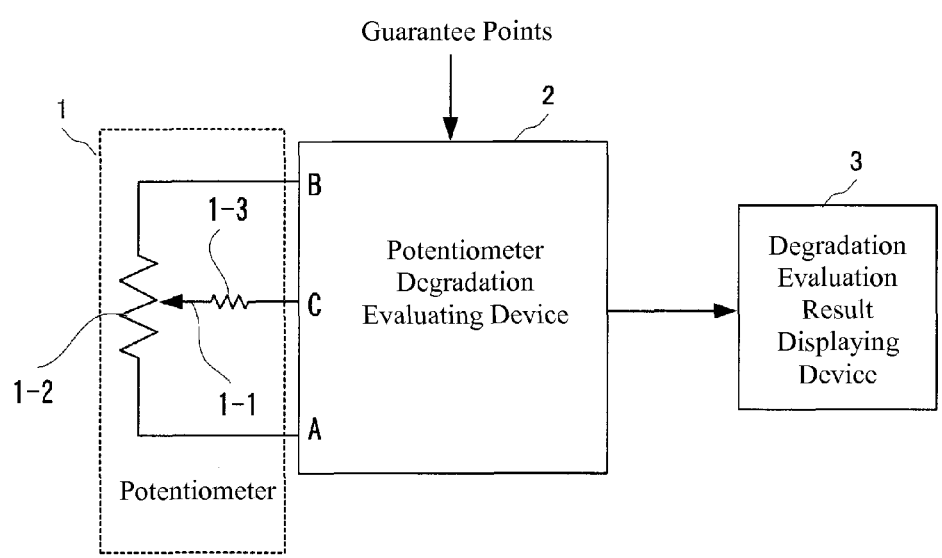
FIG. 1 is a block diagram illustrating the critical portions of a system that includes a potentiometer degradation evaluating device used in an example of the present invention.

FIG. 1 is a block diagram illustrating the critical portions of a system that includes a potentiometer degradation evaluating device used in an example of the present invention. In this figure, 1 is a potentiometer, 1-1 is a slider, 2 is a degradation evaluating device for a potentiometer (hereinafter the "potentiometer degradation evaluating device"), and 3 is an evaluation result displaying device.

In the system, the output signal of the potentiometer 1, read out by slider 1-1, is sent to the potentiometer degradation evaluating device 2. Note that in FIGS. 1, A and B are fixed electrodes of the potentiometer 1, C is a movable electrode of the potentiometer 1, 1-2 is a resistor of the potentiometer 1, and 1-3 is a contact resistance between the movable electrode C and the resistor 1-2.

This potentiometer 1 is installed with a device that causes the angular velocity of the rotating system as a whole to have a constant velocity in the steady state, in cooperation with the frequency of the power supply. For example, it may be assembled into an electric valve actuator, to detect the opening of the valve unit driven by a motor.

Moreover, in this system, the potentiometer degradation evaluating device 2 is built from hardware having a processor and a storage device, and a program that produces various types of functions in cooperation with this hardware.

It is known that the potentiometer performance degrades in the steps of a production of noise, a loss of linearity (the linearity between the input and the output), a change in resistance value, and an increase in the rotational torque. In the present form of example, the focus is on this sequence with which performance degrades, and the evaluation of the degradation of performance in the potentiometer 1 is performed through evaluating, sequentially, the production of noise, loss of linearity, change in resistance value, and increase in rotational torque.

That is, as the evaluation items for the degradation of performance before arriving at a failure in the potentiometer 1, the "production of noise," the "loss of linearity," the "change in resistance value," and the "increase in rotational torque" are established as evaluation items, and evaluations are performed in a staged manner in the sequence of the "production of noise," the "loss of linearity," the "change in resistance value," and the "increase in rotational torque." This evaluation is performed without removing the potentiometer 1 from the device, that is, with the potentiometer 1 still assembled into in the device.

Figure 2:
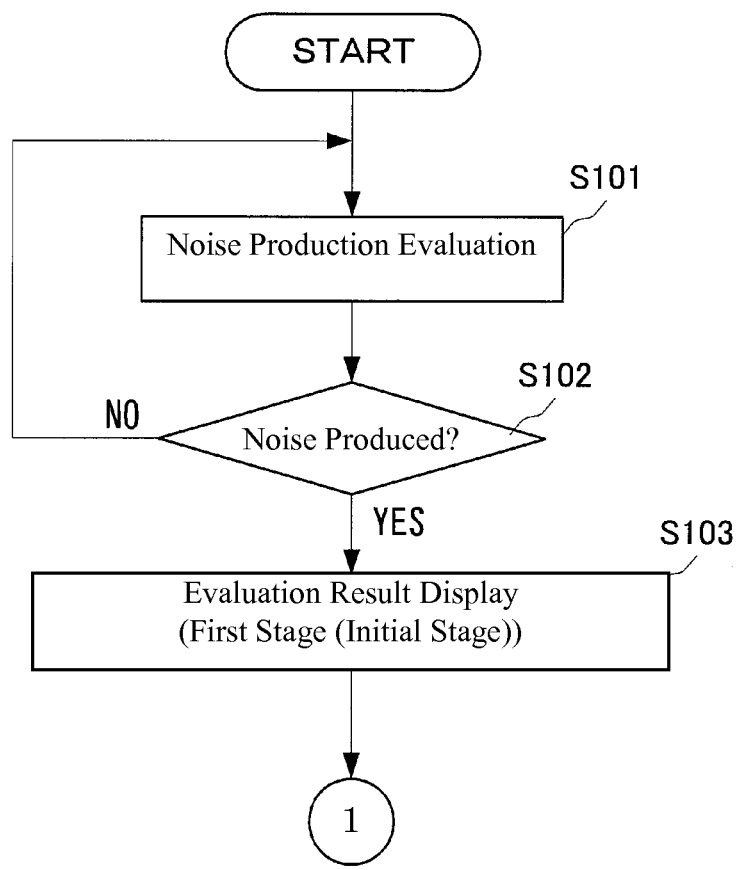
FIG. 2 is a flowchart for explaining the functions of the potentiometer degradation evaluating device in this system.
Figure 3:
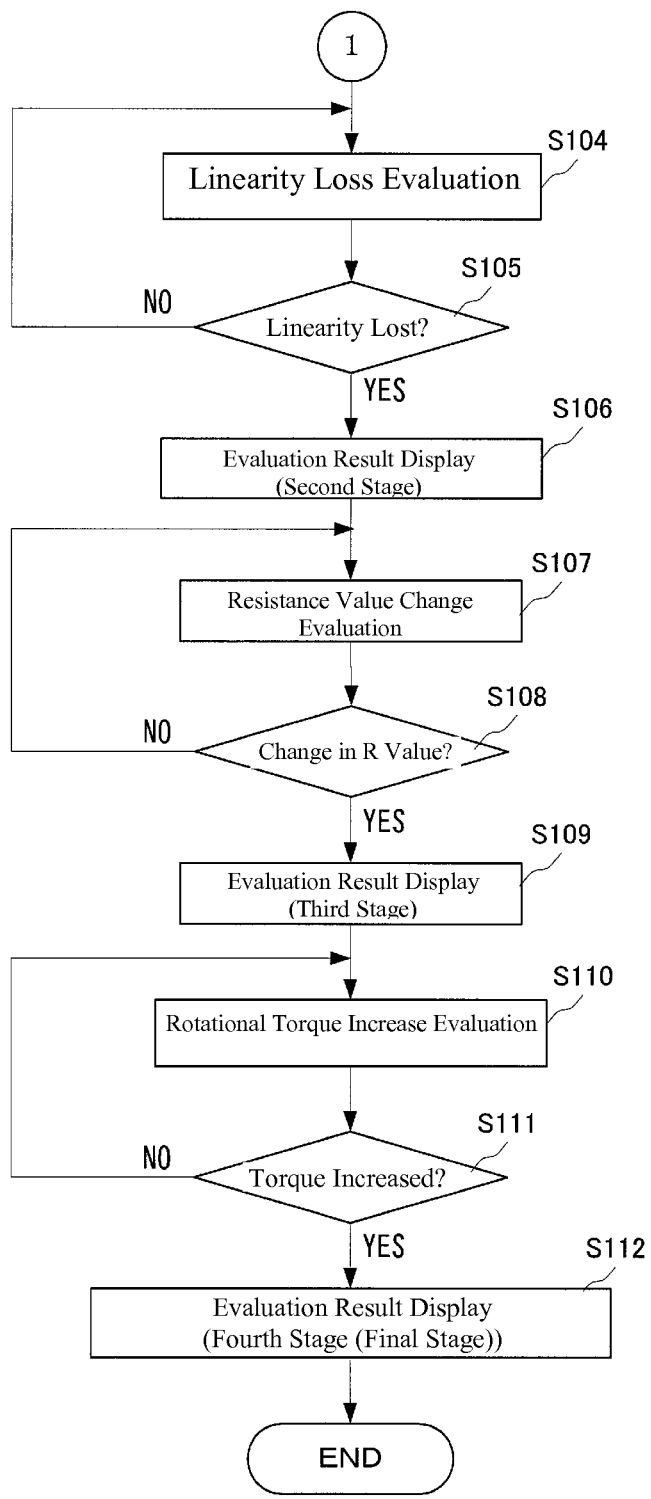
FIG. 3 is a flowchart that is a continuation of FIG. 2.

The features of the example of the potentiometer degradation evaluating device 2 will be explained below in reference to a flowchart that is split into FIG. 2 and FIG. 3.

Evaluation of the Production of Noise

The potentiometer degradation evaluating device 2 evaluates the production of noise in the potentiometer 1 (Step S101: FIG. 2).

The evaluation of the production of noise is performed through detecting spike signals that are included in the output signals from the potentiometer 1, read out from slider 1-1. If the spike signal is larger than a specific upper limit value or smaller than a lower limit value, or if the rate of change of the spike signal is greater than a specific value, the evaluation is that noise has been produced.

If the evaluation is that noise is produced (Step S102:YES), then the potentiometer degradation evaluating device 2 sends this evaluation result to the degradation evaluation result displaying device 3, which displays that the current stage of degradation of the potentiometer 1 is the noise producing stage (Stage 1 (the initial stage)) (Step S103).

Evaluation of Loss of Linearity

Following this, the potentiometer degradation evaluating device 2 evaluates the loss of linearity (Step S104: FIG. 3). The evaluation of the loss of linearity is performed as follows.

Along with measuring the output resistance value R of the potentiometer 1 in the operating state, the expected value R' at that time is calculated by the following equation:

$$R'=[(Ro,\max-Ro,\min)/t\max]\cdot t+Ro,x\% \qquad (1)$$

Note that in Equation (1), Ro,max and Ro,min are the maximum value and minimum value for the output resistance values for the range of movement of the potentiometer 1, t is the operating time since passing a guarantee point that is established in advance (and varies depending on the operating direction), tmax is the operating time from the maximum value Ro,max to the minimum value Ro,min, and our Ro,x % is the output resistance value at the guarantee point, where Ro,max and Ro,min are measured initially.

The expected values R', calculate through Equation (1) are linear interpolations that are expected values for the output resistance values at the equal intervals. The way to measure the guarantee points and the output resistance values R will be explained below.

Given this, the potentiometer degradation evaluating device 2 calculates |−R'| from the measured output resistance value R and the expected value R' at that time, and compares it to a threshold value ΔRth that is set in advance, and if |R−R'|>ΔRth, evaluates that linearity has been lost. That is, it evaluates that linearity has broken down.

If the potentiometer degradation evaluating device 2 evaluates that linearity has been lost (Step S105: YES), the evaluation result is sent to the degradation evaluation result displaying device 3, to display that the current potentiometer 1 degradation stage is the loss of linearity stage (Stage 2) (Step S106).

Evaluation of Change in Resistance Value

Following this, the potentiometer degradation evaluating device 2 evaluates the change in the resistance value (Step S107). In this evaluation of the change in the resistance value, the total resistance value $R_{A-B}$ of the potentiometer 1 is measured at regular times, and if it exceeds a given threshold value, evaluates that there is degradation. The measurement of the total resistance value $R_{A-B}$ of the potentiometer 1 will be described below.

If the evaluation is that the resistance has changed (Step S108: YES), then the potentiometer degradation evaluating device 2 sends this evaluation result to the degradation evaluation result displaying device 3, which displays that the current stage of degradation of the potentiometer 1 is the resistance change stage (Stage 3) (Step S109).

Evaluation of Increase in the Rotational Torque

Following this, the potentiometer degradation evaluating device 2 evaluates the increase in the rotational torque (Step S110). The evaluation of the increase in the rotational torque is performed as follows.

The load torque Tp when the potentiometer 1 is in the operating state is measured, and the measured load torque Tp is compared to a threshold value Tpth that is set in advance, and if Tp>Tpth, then the evaluation is that the rotational torque has increased.

The load torque Tp when the potentiometer 1 is in the operating state can be calculated by the following equation:

$$Tp=Ip\cdot(d\omega p,o/dt-d\omega p/dt) \qquad (2)$$

Note that in this Equation (2), dωp,o/dt is the angular acceleration in the transient state when the motor is driven, with the potentiometer 1 removed from the device, dωp/dt is the angular acceleration in the transient state when the motor is driven when the potentiometer 1 is assembled into the device, and Ip is the inertia of the potentiometer 1, where dωp,o/dt is measured initially. dωp/dt is calculated from the output resistance value R. Moreover, Ip is obtained from the manufacturer (a constant value). The initial measurement for dωp,o/dt and the conversion of dωp/dt from the output resistance value R will be described below.

If the evaluation is that the rotational torque has increased (Step S111: YES), then the potentiometer degradation evaluating device 2 sends this evaluation result to the degradation evaluation result displaying device 3, which displays that the current stage of degradation of the potentiometer 1 is the rotational torque degrading stage (Stage 4) (Step S112).

In this way, in the present form of example, the degradation of performance in the potentiometer 1 allows the state of progress of degradation to be known in terms of stages. This makes it possible to eliminate an evaluation in too early a stage that there is a failure, to thereby improve the system uptime, and to perform part replacement with the appropriate timing depending on the state of use.

Method for Measuring the Resistance Values

Figure 4:
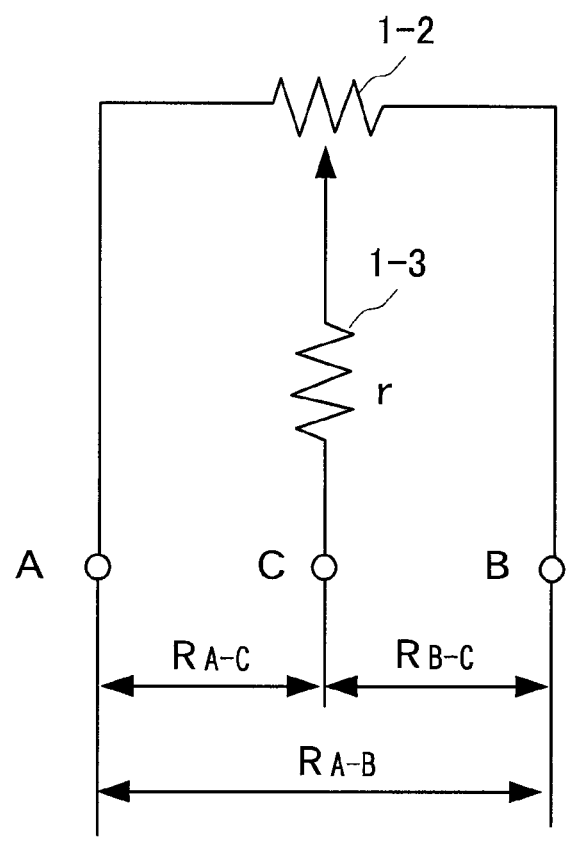
FIG. 4 is a diagram for explaining the definition of the resistance values between the electrodes of the potentiometer.

The method for measuring the resistance values used in the various degradation evaluations is given below. As illustrated in FIG. 4, the resistance value between the fixed terminals A and C of the potentiometer 1 is defined as $R_{A-C}$, the resistance value between the B and C is defined as $R_{B-C}$, and the resistance value between A and B is defined as $R_{A-B}$ (the total resistance value). Moreover, the resistance value (the contact resistance value) of the contact resistance 1-3 between the movable electrode C and the resistor 1-2 is defined as r.

(1) Measuring the Total Resistance Value $R_{A-B}$

Figure 5:
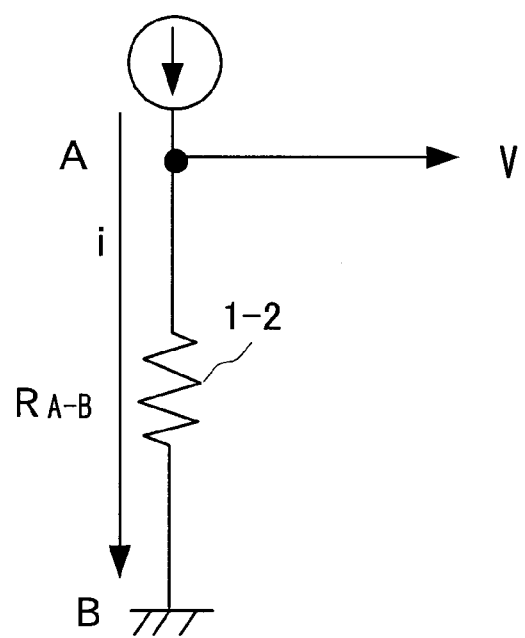
FIG. 5 is a diagram for explaining the measurement of the total resistance value $R_{A-B}$.

As illustrated in FIG. 5, a constant current i is applied between the terminals A and B, and the voltage V at that time is measured. The resistance value $R_{A-B}$ is calculated from Ohm's law by the following equation:

$$R_{A-B} = V/i \quad (3)$$

(2) Measuring the Contact Resistance Value r

Figure 6:
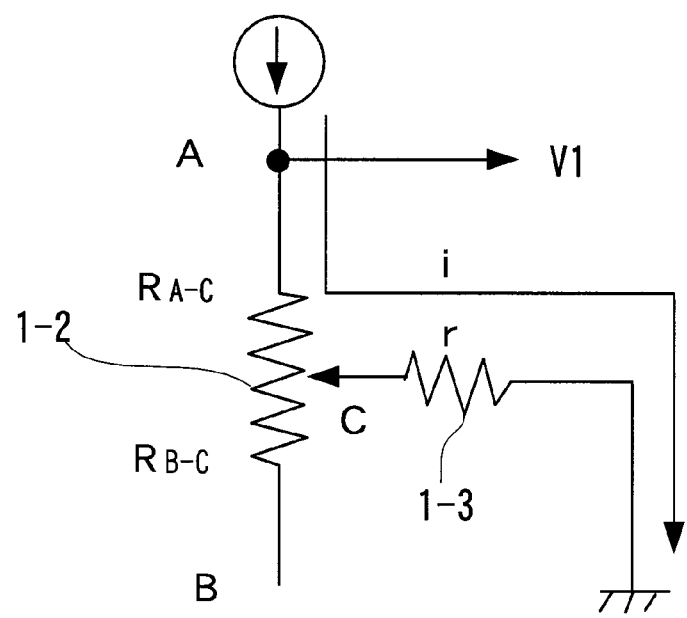
FIG. 6 is a diagram for explaining a voltage V1 used when measuring the contact resistance value r and the inter-terminal resistance values $R_{A-C}$ and $R_{B-C}$.
Figure 7:
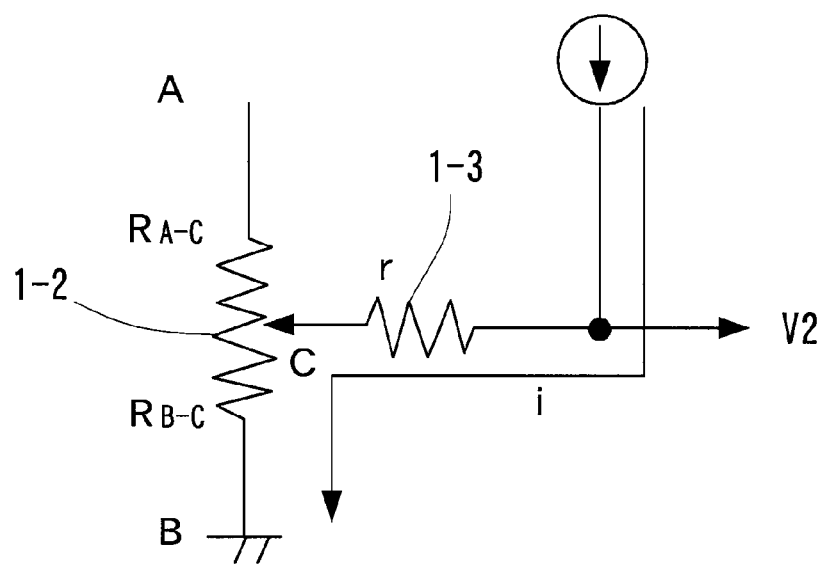
FIG. 7 is a diagram for explaining a voltage V2 used when measuring the contact resistance value r and the inter-terminal resistance values $R_{A-C}$ and $R_{B-C}$.

As illustrated in FIG. 6, a constant current i is applied between the terminals A and C, and the voltage V1 at that time is measured. Next, as illustrated in FIG. 7, a constant current i is applied between the terminals C and B, and the voltage V2 at that time is measured. These values can be written as the following equations:

$$V1 = (R_{A-C} + r) \cdot i \quad (4)$$

$$V2 = (R_{B-C} + r) \cdot i \quad (5)$$

Consequently, the contact resistance value r can be calculated as follows:

$$r = \{[(V1+V2)/i] + R_{A-B}\}2 \quad (6)$$

(3) Measuring the Inter-Terminal Resistance Values $R_{A-C}$ and $R_{B-C}$

The inter-terminal resistance values $R_{A-C}$ and $R_{B-C}$ can be calculated as follows:

$$R_{A-C} = V1/i - r \quad (7)$$

$$R_{B-C} = V2/i - r \quad (8)$$

Detail of the Evaluation of Loss of Linearity

The maximum value Ro,max and the minimum value Ro,min of the output resistance values in the range of movement of the potentiometer 1 are measured in advance.

Following this, the expected resistance value is calculated for each specific opening interval (for example, for openings in an electric valve actuator, these are points such as 20, 40, 60, and 80%, where these intervals are set so that a number of points will be passed at the time of the evaluation).

The calculation performs linear interpolation of the maximum and minimum output resistance values, defining these values as $Ro,_{20}\%$, $Ro,_{40}\%$, and so forth. A module able to guarantee the accuracy of the absolute positioning at the aforementioned constant openings is installed separately in the equipment (for example, wherein a disk having a radial slit is secured completely to the object for which the rotational angle is to be measured, where the passage of light is confirmed through a photocoupler), where each of these individual points are defined as guarantee points.

Figures 8, 9:
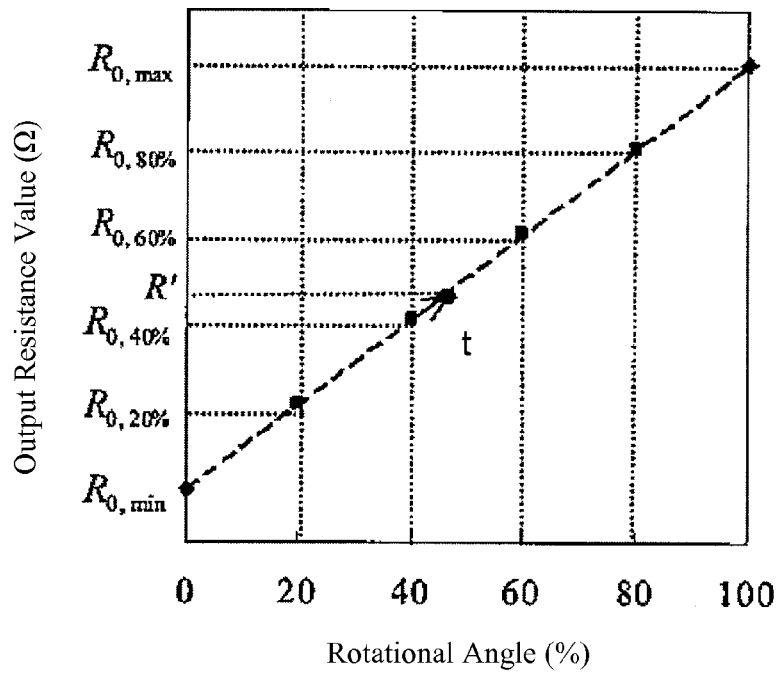
FIG. 8 is a diagram for explaining the expected value R' calculated as a value through linear interpolation.
FIG. 9 is a diagram illustrating resistance value change speed and acceleration, calculated through the difference method.

The evaluation begins when one of these guarantee points has been passed, where, in the operating state, the output resistance value R is measured and, at that time, the expected value R' is calculated by Equation (1), above (referencing FIG. 8).

Given this, |R−R'| is calculated from the measured output resistance value R and the expected value R' at that time, and compared to a threshold value ΔRth that is set in advance, and if |R−R'|>ΔRth, the evaluation is that linearity has been lost. Note that the output resistance value R is calculated through the "(2) Measurement of the Contact Resistance Value r" and Δ(3) Measurement of the Inter-terminal Resistances $R_{A-C}$ and $R_{B-C}$).

Details of the Evaluation of the Change in Resistance Values

The total resistance value $R_{A-B}$ is measured regularly, and if it exceeds a given threshold value, then the evaluation is that there has been degradation. The method for measuring the total resistance value $R_{A-B}$ is as per "(1) Measuring the Total Resistance Value $R_{A-B}$"

Detail of Evaluation of the Increase in the Rotational Torque

The potentiometer 1 is first removed from the device, the motor is driven, and, in a transient state, the angular acceleration dωo/dt is measured by a rotation meter, or the like. When the gear ratio is defined as i, the angular acceleration of the potentiometer axis conversion will be:

$$d\omega p, o/dt = (1/i) \cdot d\omega o/dt \quad (9)$$

The potentiometer 1 is assembled into the device. The angular acceleration dωa/dt of the potentiometer 1 in a transient state after assembly into the device is calculated as described below. If, for example, there are changes of 21, 22, and 24 ohms at small time intervals 0.1 s from the time at which a potentiometer with a total resistance of 1 kΩ was at a rotational angle of 320°, then, as shown in FIG. 9, the speed of change of the resistance value, and the acceleration thereof, can be calculated using the difference method. As a result, the angular acceleration in the potentiometer at this time would be:

$$d\omega a/dt = 50 \times (320 \times \pi/180)/10000 = 2.79e-003 \ [rad/s^2]$$

Here the angular motion equation when there is no load torque on the potentiometer 1 is:

$$Ip \cdot (d\omega p, o/dt) = T \quad (10)$$

where T is the torque with which the potentiometer 1 is driven, and Ip is the inertia of the potentiometer alone (a constant value, obtained from the manufacturer).

On the other hand, the angular motion equation when there is a load on the potentiometer 1 is:

$$Ip \cdot (d\omega a/dt) = T - Tp \quad (11)$$

The load torque Tp of the potentiometer 1 can be calculated from Equations (10) and (11) as follows:

$$Tp = Ip \cdot (d\omega p, o/dt - d\omega p/dt) \quad (12)$$

Figure 10:
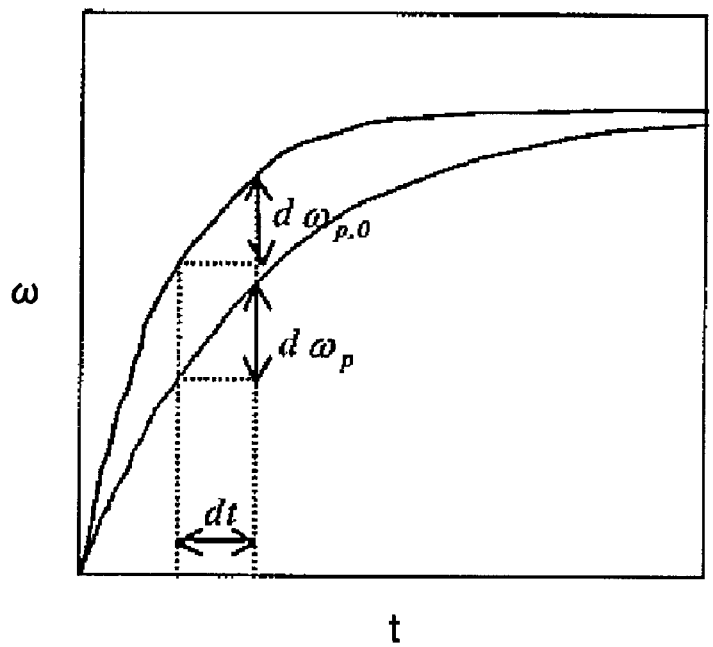
FIG. 10 is a diagram illustrating the $d\omega p,o/dt$ and $d\omega p,dt$ in a transient state.
Figure 11:
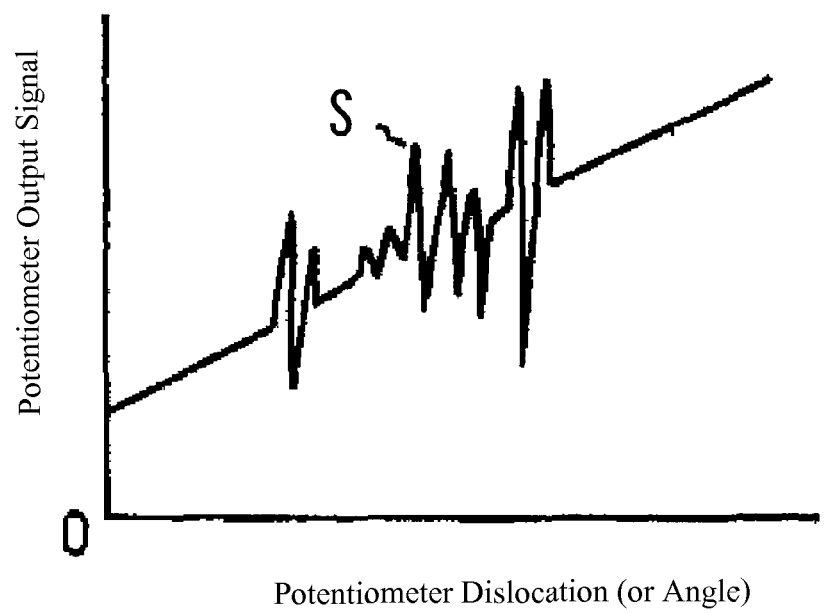
FIG. 11 is a diagram illustrating a spike signal that appears in the output signal of the potentiometer.

Because here, in the transient state, $d\omega p,o/dt > d\omega o/dt$, $d\omega p,o/dt \neq 0$, $d\omega o/dt \neq 0$, as in FIG. 10, it is possible to calculate Tp in a device wherein the angular velocity of the rotational system as a whole would be a constant velocity in a steady-state, interlocked with the power supply frequency.

These values for Tp are measured and calculated at various times, and if they exceed the threshold value Tpth, then the evaluation is that there has been an increase in the rotational torque.

Extended Forms of Example

While the present invention has been explained above in reference to the form of example, the present invention is not limited to the above-discussed form of example. The structures and details in the present invention may be varied in a variety of ways, as can be understood by one skilled in the art, within the scope of technology in the present invention.

The invention claimed is:

1. A method for evaluating degradation of a potentiometer in stages using an potentiometer degradation evaluating device, wherein the potentiometer is linked to a motor, the method comprising:

providing the potentiometer degradation evaluating device that performs a plurality of evaluation items as evaluation items for degradation in performance prior to failure of a potentiometer; and evaluating, by the potentiometer degradation evaluating device, the degradation of performance of each of the plurality of evaluation items, in terms of stages, in a specific sequence from the evaluation item on a minor degradation to the evaluation item on a major degradation, the plurality of evaluation items including at least an evaluation of an increase in a rotational torque of a potentiometer axis, wherein the evaluating step includes the step of further evaluating whether a load torque of the potentiometer alone is increased over a threshold value when the load torque is a factor of an angular acceleration of the motor.

2. The method for evaluating degradation of a potentiometer as set forth in claim 1, wherein a production of noise is evaluated as the evaluation item for the degradation of performance of the potentiometer, and when the production of noise is recognized, a loss of linearity between an input and an output is evaluated, when the loss of linearity is recognized, a change in a resistance value is evaluated, and when the change in the resistance value is recognized, the increase in the rotational torque of the potentiometer axis is evaluated.

3. The method for evaluating degradation of a potentiometer as set forth in claim 1, wherein a production of noise is evaluated as the evaluation item for the degradation of performance of the potentiometer, and when the production of noise is recognized, a loss of linearity between an input and an output is evaluated.

4. The method for evaluating degradation of a potentiometer as set forth in claim 1, wherein a loss of linearity between an input and an output is evaluated as the evaluation item for the degradation of performance of the potentiometer, and when the loss of linearity is recognized, a change in a resistance value is evaluated.

5. The method for evaluating degradation of a potentiometer as set forth in claim 1, wherein:

a change in a resistance value is evaluated as the evaluation item for the degradation of performance of the potentiometer, and when the change in the resistance value is recognized, the rotational torque of the potentiometer axis is evaluated.

6. The method for evaluating degradation of a potentiometer as set forth in claim 1, wherein the load torque is calculated by multiplying an inertia of the potentiometer by a difference between the angular acceleration in the transient state when the motor is driven while the potentiometer removed from a device having the motor, and the angular acceleration in the transient state when the motor is driven while the potentiometer is assembled into the device.

* * * * *